United States Patent
Inam et al.

(10) Patent No.: US 11,116,116 B1
(45) Date of Patent: Sep. 7, 2021

(54) INTERFERENCE LIMITING ENCLOSURE FOR POWER FLOW DEVICES

(71) Applicant: Smart Wires Inc., Union City, CA (US)

(72) Inventors: Haroon Inam, San Jose, CA (US); Ali Farahani, Yorba Linda, CA (US); Govind Chavan, Union City, CA (US); Arthur Kelley, Cary, NC (US); Shaiq Aman-ul-haq, Rawalpindi (PK); Amrit Iyer, Oakland, CA (US)

(73) Assignee: Smart Wires Inc., Union City, CA (US)

(*) Notice: Subject to any disclaimer, the term of this patent is extended or adjusted under 35 U.S.C. 154(b) by 193 days.

(21) Appl. No.: 16/557,729

(22) Filed: Aug. 30, 2019

Related U.S. Application Data

(60) Provisional application No. 62/780,015, filed on Dec. 14, 2018.

(51) Int. Cl.
| | |
|---|---|
| *H05K 9/00* | (2006.01) |
| *H01C 7/108* | (2006.01) |
| *H01H 33/66* | (2006.01) |

(52) U.S. Cl.
CPC .......... *H05K 9/0081* (2013.01); *H01C 7/108* (2013.01); *H01H 33/66* (2013.01); *H05K 9/0003* (2013.01); *H05K 9/0007* (2013.01)

(58) Field of Classification Search
CPC ........................ H05K 9/0003; H05K 9/0007
See application file for complete search history.

(56) References Cited

U.S. PATENT DOCUMENTS

| | | | |
|---|---|---|---|
| 4,894,748 A | 1/1990 | Shefet | |
| 5,243,126 A * | 9/1993 | Chow | B32B 23/04 174/388 |
| 5,325,813 A | 7/1994 | Sutton, Jr. | |
| 5,434,368 A | 7/1995 | Hoffmann | |
| 5,670,936 A | 9/1997 | Estes et al. | |
| 6,205,019 B1 | 3/2001 | Krom | |
| 6,778,390 B2 | 8/2004 | Michael | |
| 7,290,606 B2 | 11/2007 | Coronado et al. | |
| 7,515,444 B2 | 4/2009 | Chen | |
| 7,626,817 B2 | 12/2009 | Rapp | |
| 9,371,067 B2 | 6/2016 | Dao et al. | |
| 9,593,665 B2 | 3/2017 | Santana | |
| 9,774,409 B1 * | 9/2017 | Lee | G01R 29/0821 |
| 2002/0046879 A1 * | 4/2002 | Barabash | H01Q 9/0407 174/258 |
| 2002/0172008 A1 | 11/2002 | Michael | |

(Continued)

*Primary Examiner* — Hung V Ngo
(74) *Attorney, Agent, or Firm* — Womble Bond Dickinson (US) LLP

(57) ABSTRACT

An enclosure includes a power flow control device to attach to a high voltage transmission line, a plurality of panels formed of metal, a shorting connection provided between each pair of panels, an electrical connection from at least one panel of the plurality of panels to the high voltage transmission line, a receiving region provided on each panel for each shorting connection, and an equipotential surface for reducing electromagnetic interference from the high voltage transmission line to internal components of the power flow control device, and from the internal components of the power flow control device to the high voltage transmission line.

20 Claims, 5 Drawing Sheets

(56) References Cited

U.S. PATENT DOCUMENTS

| | | | |
|---|---|---|---|
| 2003/0042990 A1* | 3/2003 | Schumacher | H05K 9/0062 |
| | | | 333/12 |
| 2004/0131898 A1 | 7/2004 | Zhang et al. | |
| 2006/0076150 A1 | 4/2006 | Coronado et al. | |
| 2006/0273814 A1 | 12/2006 | Rapp | |
| 2008/0060371 A1 | 3/2008 | Jude | |
| 2012/0292095 A1* | 11/2012 | Cordes | H05K 9/0001 |
| | | | 174/378 |
| 2014/0008119 A1* | 1/2014 | Brandt | H05K 9/0073 |
| | | | 174/382 |
| 2015/0191162 A1 | 7/2015 | Dao et al. | |
| 2016/0057895 A1* | 2/2016 | Cordes | H05K 9/0018 |
| | | | 361/816 |
| 2016/0183416 A1* | 6/2016 | Baecklund | H05H 7/02 |
| | | | 315/502 |
| 2016/0207636 A1* | 7/2016 | Yokoi | H05K 9/0003 |
| 2017/0219230 A1 | 8/2017 | Agnaou et al. | |
| 2019/0124800 A1* | 4/2019 | Bodi | B32B 15/04 |
| 2020/0229328 A1* | 7/2020 | Deighton | E04B 1/34321 |

* cited by examiner

US 11,116,116 B1

INTERFERENCE LIMITING ENCLOSURE FOR POWER FLOW DEVICES

CROSS REFERENCE TO RELATED APPLICATIONS

This application claims priority to Provisional Application No. 62/780,015, filed on Dec. 14, 2018, the disclosure of which is incorporated by reference herein in its entirety.

TECHNICAL FIELD

This invention relates to an enclosure for a power flow device and in particular to an enclosure for a power flow device having a shorting strap connection to a high voltage transmission line.

BACKGROUND

Power flow devices (also known as "power flow control devices") connected to high voltage transmission lines typically include digital circuits operating at 5 volts or less, together with high current switching devices that can switch hundreds of amps while balancing power flow in the transmission line. Electromagnetic interference (EMI) can occur from the transmission line to the power flow device, and from the power flow device to the transmission line.

Accordingly, there is a need in the art for an EMI limiting enclosure for such power flow devices, wherein circuits internal to the power flow device are protected from voltages induced from the high voltage transmission lines, and the switching of high currents internal to the power flow device does not interfere with the current waveform carried by the high voltage transmission line.

BRIEF DESCRIPTION OF THE DRAWINGS

Embodiments of the disclosure are illustrated by way of example and not limitation in the figures of the accompanying drawings in which like references indicate similar elements.

DETAILED DESCRIPTION

Figure 1:
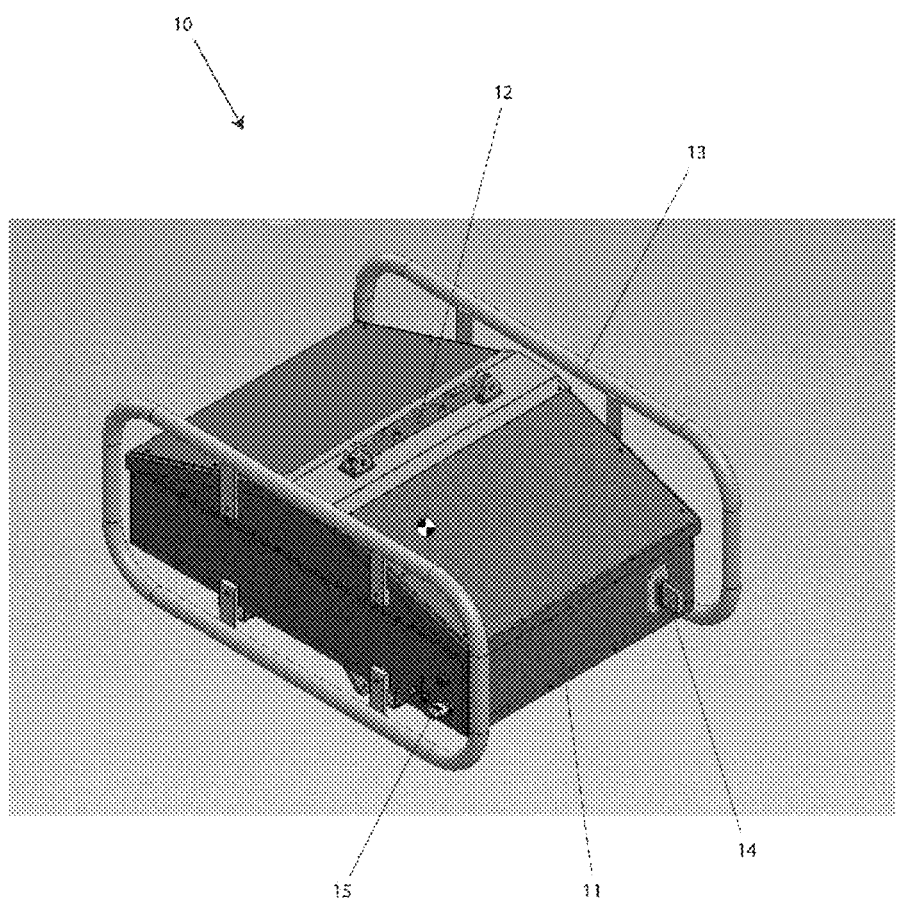
FIG. 1 is a perspective external view of an exemplary power flow device of the present disclosure.

Various embodiments and aspects of the disclosures will be described with reference to details discussed below, and the accompanying drawings will illustrate the various embodiments. The following description and drawings are illustrative of the disclosure and are not to be construed as limiting the disclosure. Numerous specific details are described to provide a thorough understanding of various embodiments of the present disclosure. However, in certain instances, well-known or conventional details are not described in order to provide a concise discussion of embodiments of the present disclosures.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

In the present disclosure a short-circuiting connection shall be described as a "shorting connection", and a short-circuiting strap shall be described as a "shorting strap".

In one aspect of the present disclosure, an enclosure includes a power flow control device to attach to a high voltage transmission line, a plurality of panels formed of metal, a shorting connection provided between each pair of panels, an electrical connection (shorting connection) from at least one panel of the plurality of panels to the high voltage transmission line, a receiving region provided on each panel for each shorting connection, and an equipotential surface for reducing electromagnetic interference from the high voltage transmission line to internal components of the power flow control device, and from the internal components of the power flow control device to the high voltage transmission line.

In another aspect of the present disclosure, a method for reducing electrical interference in a power flow control device connected to a high voltage transmission line, includes providing a sealed enclosure around the power flow control device wherein a plurality of panels, formed of metal, are attached together with conductive gaskets therebetween, providing a shorting connection between each pair of the plurality of panels, providing an electrical connection between at least one of the plurality of panels and the high voltage transmission line, providing a receiving region on each panel for each shorting connection, and providing an equipotential assembly that floats at a potential of the high voltage transmission line. The equipotential assembly comprises the sealed enclosure and whereby electromagnetic interference is reduced from the high voltage transmission line to internal components of the power flow control device, and from the internal components of the power flow control device to the high voltage transmission line.

In one embodiment, an aluminum enclosure is described for limiting electromagnetic interference arising from high currents and high voltages in neighboring components of power flow control systems. The protective enclosure is provided with shorting straps between panels to create an equipotential assembly that floats at the HV line potential. The equipotential assembly provides isolation between internal and external electromagnetic fields, similar in function to a Faraday cage. For responding to a fault current, a bypass circuit comprising high current switches (SCRs for example) is described, together with a protective circuit comprising a vacuum interrupter (VI) and differential mode chokes (DMCs).

FIG. 1 depicts an exemplary interference limiting enclosure 10 according to one embodiment of the present disclosure, which includes a bypass switch that can be used to bypass an impedance injection module attached to a high voltage transmission line. The bypass switch may be activated if a fault in the impedance injection module occurs or is deemed to be imminent or at risk. The principles described herein for building and deploying enclosure 10 can be applied to any power flow control device. Among power flow devices, enclosure 10 can be used with transformer-based devices, as well as transformerless Flexible AC Transmission Systems (FACTS). A typical power flow control device may be attached to a transmission line carrying 390 kV and may switch currents up to 850 amps as an example.

Continuing with FIG. 1, enclosure 10 includes aluminum panels such as 11 shown in the figure. The panels are bolted tightly together, including conductive gaskets between mating surfaces of panels. A means for compressing the conductive gaskets between the mating surfaces of the panels may suitably include the bolts which hold the panels tightly together. A lifting bracket 12 mounted on the top of enclosure 10 is shown for installation purposes such as deployment using a crane. A pair of corona rings 13 is shown mounted externally to enclosure 10, for limiting or reducing arcs that could otherwise form to ground or to adjacent structures. A pair of power line conductors mounted externally to enclosure 10 to connect to the HV transmission line may include a NEMA connector 14 as shown for connecting to a high voltage transmission line; the transmission line may be cut to insert the power flow device. Alternatively, the power flow device may be installed at a power distribution substation. A second NEMA connector is provided on the distal side of enclosure 10. A metal oxide varistor 15 (MOV) is shown, providing protection against transient voltage spikes having a peak voltage up to 1.8 million volts, typically with a duration measured in microseconds.

Figure 2:
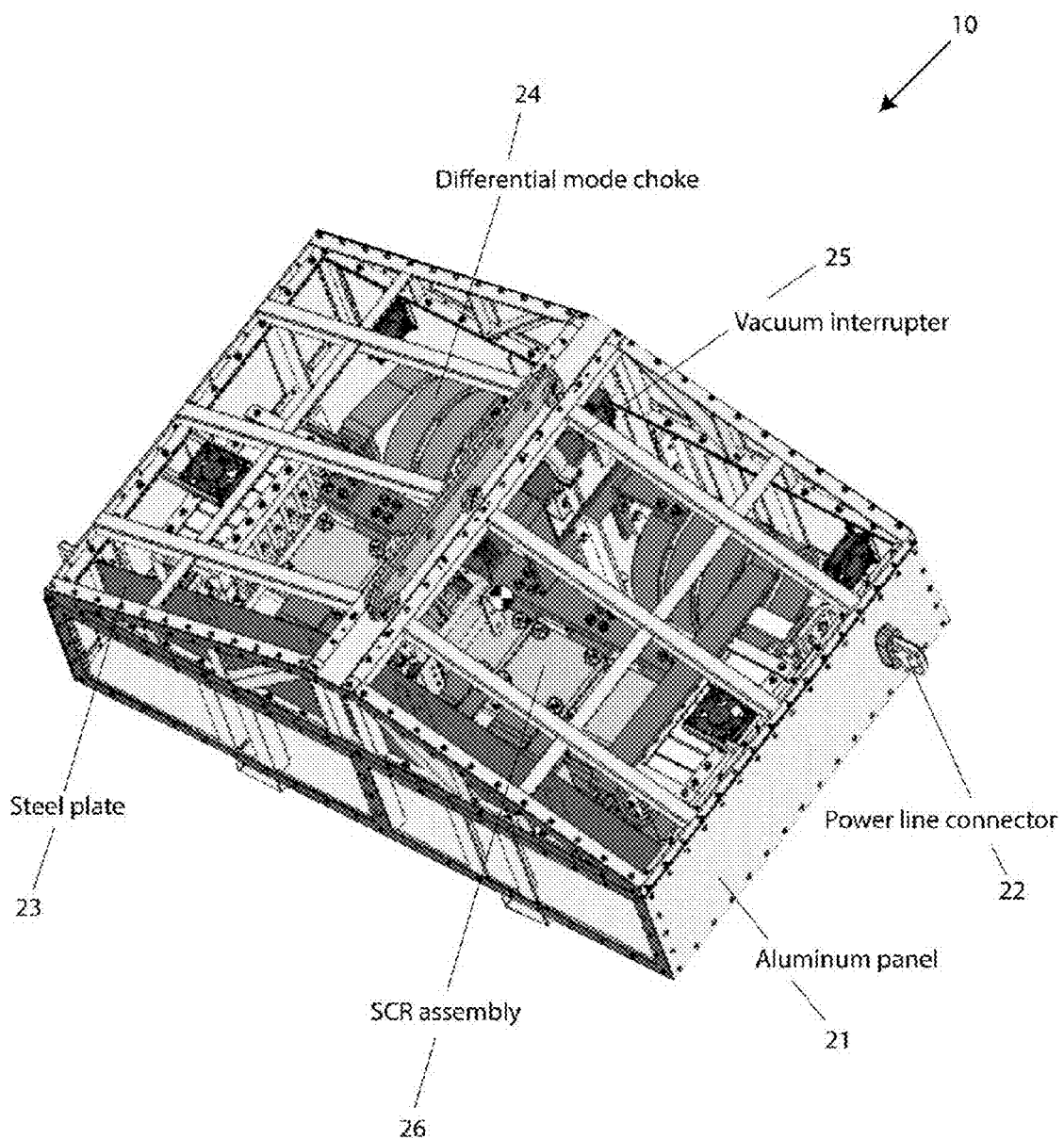
FIG. 2 is a perspective internal view of the power flow device depicted in FIG. 1.

FIG. 2 illustrates an arrangement of components internal to enclosure 10 of FIG. 1. An aluminum panel 21 is shown, together with a NEMA power line connector 22. A steel plate 23 divides enclosure 10 into two compartments: one for high current devices, and the other for low current or low voltage devices such as microprocessors and other digital electronic components. A steel plate 23 is effective at attenuating magnetic effects that could otherwise disturb the digital electronic components, especially arising from high currents flowing in the adjacent compartment. A pair of differential mode chokes (DMCs) is shown 24, and a vacuum interrupter (VI) 25. A series of high current switches is shown, in this case an assembly 26 of silicon-controlled rectifiers (SCRs). The circuit operation of the devices shown in FIG. 2 will be described in reference to FIG. 4.

Figure 3:
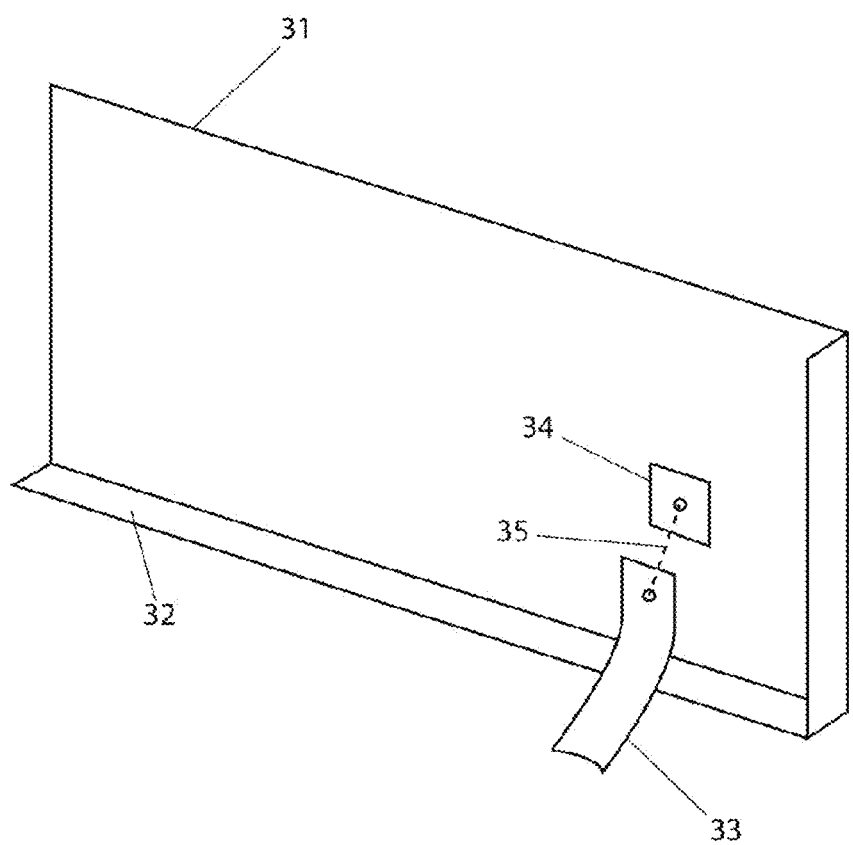
FIG. 3 is a perspective view of a shorting strap attached to an aluminum panel of the power flow device depicted in FIG. 1.

FIG. 3 illustrates an aluminum panel 31 having flanges 32 for attaching to other panels. A shorting connection includes a shorting strap 33 as shown, wherein the shorting strap may be electrically connected with low contact resistance to a specially prepared (masked) area or receiving region 34 on panel 31. Masked area 34 may be abraded to remove oxide material, and it may be coated with conductive material that resists oxidation. In enclosure 10, shorting straps 33 provide low resistance connections between each pair of panels. An acceptable contact resistance may be less than 5µΩ for example. A fastener such as a threaded bolt and nut combination may be used to fasten 35 the shorting strap to the masked area. In addition, a shorting strap such as 33 in FIG. 3 may be used to connect one of the aluminum panels to the high voltage transmission line, thereby electrically floating the enclosure at the potential of the transmission line, together with its installed equipment.

With reference again to FIGS. 1 and 3, enclosure 10 includes a power flow control device 40 (see FIG. 4) to attach to a high voltage transmission line 42 (see FIG. 4), a plurality of panels 11 formed of metal, a shorting connection 33 provided between each pair of panels, an electrical connection (for example, a shorting strap such as shorting strap 33) from at least one panel of the plurality of panels to the high voltage transmission line 42, a receiving region 34 provided on each panel for each shorting connection, and an equipotential surface (for example, outside surface of enclosure 10) for reducing electromagnetic interference from the high voltage transmission line 42 to internal components of the power flow control device 40, and from the internal components of the power flow control device 40 to the high voltage transmission line 42. In one embodiment, shorting strap 33 may include an abraded copper conductor. In one embodiment, the plurality of panels 11 are aluminum panels. In other embodiments, the plurality of panels 11 are formed of other metals such as alloys of aluminum, magnesium, titanium, and beryllium.

Figure 4:
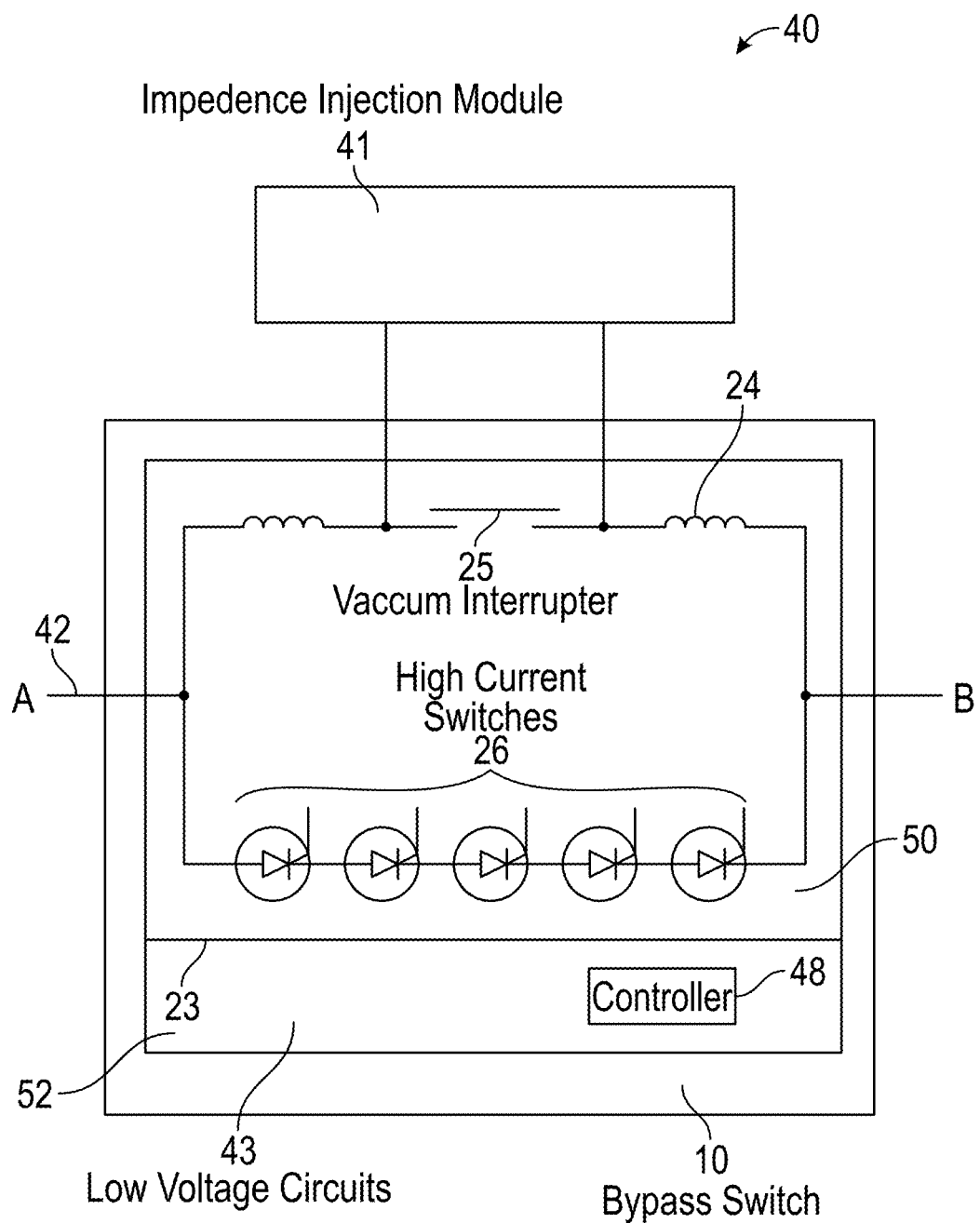
FIG. 4 is a schematic of a bypass switch connected in series with a HV transmission line and integrated with an impedance injection module.

FIG. 4 illustrates a power flow control device 40 comprising an impedance injection module 41, and a bypass switch 10 connected in series with a HV transmission line 42. Physical forms of a vacuum interrupter (VI) 25, a differential mode choke (DMC) 24, and an assembly of high current switches (for example SCRs) 26 are depicted in FIG. 2; they are shown in circuit form in FIG. 4. Steel plate 23 is also shown in FIG. 4, separating or dividing enclosure 10 of bypass switch 10 into a high current compartment and a low current compartment. The high current compartment may be a first current area 50 and the low current compartment may be a second current area 52 which is lower in current than the first current area. Low voltage circuits 43 such as a controller 48 are disposed in the low current compartment.

Continuing with FIG. 4, power flow control device 40 further includes a plurality of current (e.g., high current) switches 26 which are connected in series and configured to function as a current bypass switch during a fault condition to be described in more detail below. Current switches 26 may be implemented as silicon-controlled rectifiers (SCRs), for example. Power flow control device 40 further includes an impedance injection module 41, a vacuum interrupter 25 to interrupt a current flowing in high voltage transmission line 42, and at least one differential mode choke 24 connected in series with vacuum interrupter 25. In one embodiment, a pair of differential mode chokes 24 may be used in series with vacuum interrupter 25, creating a branch of bypass switch 10 that serves to limit current spikes as well as provide a current interrupter. In one embodiment, a plurality of current switches 26 are connected in parallel with the at least one differential mode choke 24 and vacuum interrupter 25, in which the plurality of current switches 26 is configured to function as a current bypass switch during a fault condition when vacuum interrupter 25 is closed.

Continuing with FIG. 4, in operation, a fault current (e.g., a fault condition) may occur in impedance injection module 41. Such a fault current may be caused by a short to ground, or an internal short in module 41, or a short between modules attached to the HV transmission line. Alternatively, a fault current may be occurring in HV transmission line 42 and passing through module 41. In any of these cases it is normally desirable to bypass the fault current through an assembly of high current switches such as assembly 26 shown in the figure. Such a bypass operation may protect impedance injection module 41 from damage, or from further damage. Vacuum interrupter 25 is normally closed to create a fail-safe configuration when no power is applied to bypass switch 10. This fail-safe configuration may be described as "monitor mode". The switches in high current switch assembly 26 are normally open and become closed when so commanded by controller 48. When impedance injection module 41 is entering injection mode to inject a load balancing impedance into HV transmission line 42, vacuum interrupter 25 is opened as shown in FIG. 4 to force the transmission line current through module 41. The voltage across terminals A and B, and the current flowing from A to B are continuously monitored during operation. If a fault is detected, controller 48 will close the switches in assembly 26 of high current switches to dump the fault current through this branch of the circuit. Impedance injection module 41 will continue in monitor mode. Most of the fault current will flow through the assembly 26 of high current switches, but a fraction of the total current may flow through the circuit branch containing the DMCs and the vacuum interrupter. After a delay of around 1-3 seconds, it can be anticipated that a circuit breaker upstream will activate, and the requirement to handle the fault current in the circuits shown in FIG. 4 will be removed.

Figure 5:
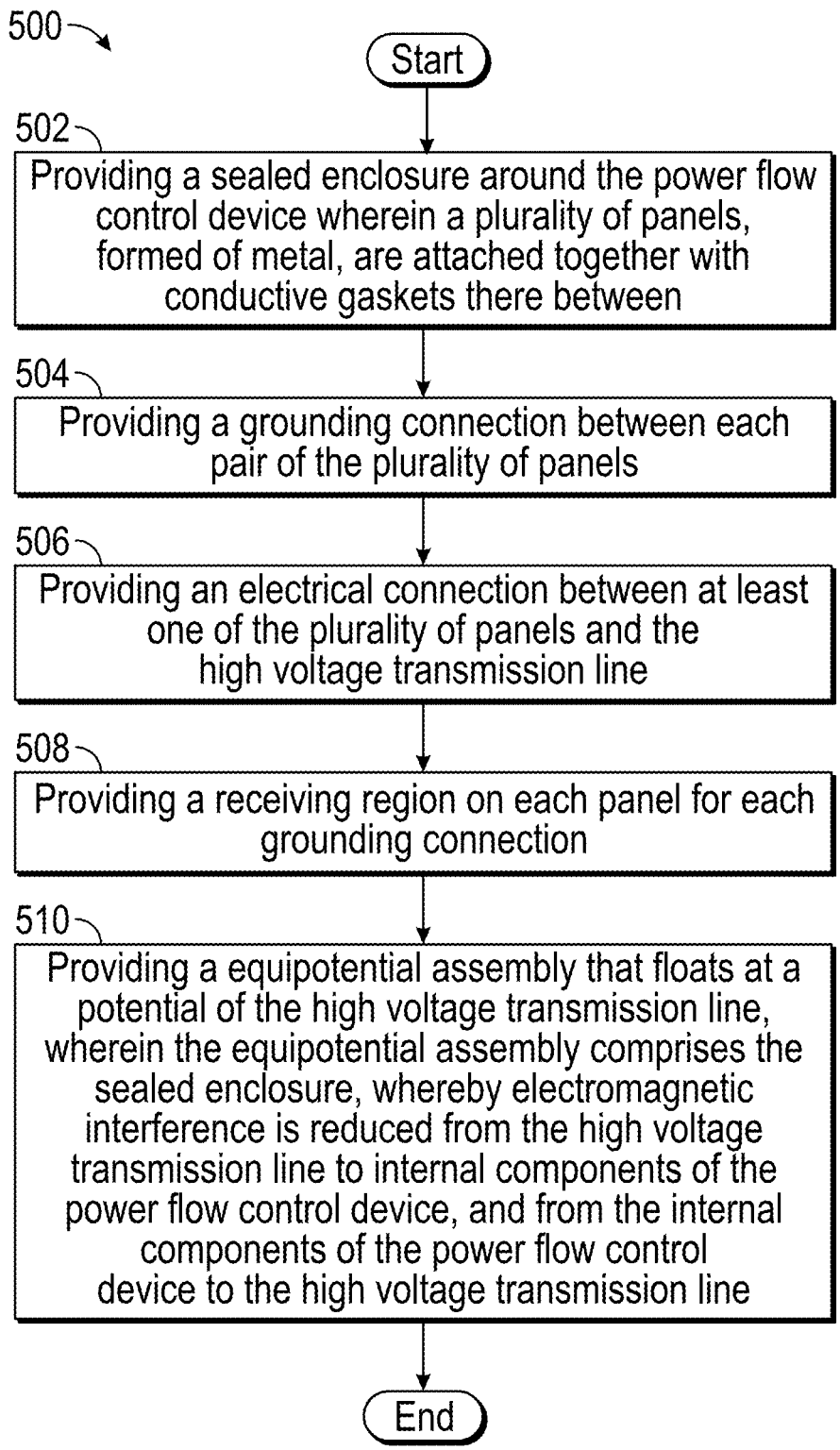
FIG. 5 is a flow diagram of a method for reducing electrical interference in a power flow control device connected to a high voltage transmission line in accordance with one embodiment of the present disclosure.

FIG. 5 illustrates a flow diagram 500 of a method for reducing electrical interference in a power flow control device connected to a high voltage transmission line in accordance with one embodiment of the present disclosure. The flow diagram includes at operation 502, providing a sealed enclosure around the power flow control device wherein a plurality of panels, formed of metal, are attached together with conductive gaskets therebetween, at operation 504, providing a shorting connection between each pair of the plurality of panels, at operation 506, providing an electrical connection between at least one of the plurality of panels and the high voltage transmission line, at operation 508, providing a receiving region on each panel for each shorting connection, and at operation 510, providing an equipotential assembly that floats at a potential of the high voltage transmission line, wherein the equipotential assembly comprises the sealed enclosure, whereby electromagnetic interference is reduced from the high voltage transmission line to internal components of the power flow control device, and from the internal components of the power flow control device to the high voltage transmission line. In one embodiment, the method may further include providing a steel plate for dividing the sealed enclosure into a first current area and a second current area which is lower in current than the first current area.

In one embodiment, the method may further include providing a plurality of current switches connected in series and configured to function as a current bypass switch during a fault condition. In one embodiment, the method may further include interrupting, by using a vacuum interrupter, a current flowing in a sensing/interrupter branch of the current bypass switch. In one embodiment, the method may further include connecting, by using a pair of power line connectors, the power flow control device to the high voltage transmission line. In one embodiment, the method may further include identifying, by a controller, that a fault current exists in an impedance injection module, closing a vacuum interrupter in response to identifying that the fault current exists, the vacuum interrupter coupled in series with at least one differential mode choke, and closing a plurality of current switches to pass the fault current, the plurality of current switches coupled in parallel with the vacuum interrupter and the at least one differential mode choke, whereby the impedance injection module is protected from the fault current.

The processes or methods depicted in the preceding figures may be performed in part by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

What is claimed is:

1. An enclosure comprising:
   a power flow control device to attach to a high voltage transmission line;
   a plurality of panels formed of metal;
   a shorting connection provided between each pair of panels;
   an electrical connection from at least one panel of the plurality of panels to the high voltage transmission line;
   a receiving region provided on each panel for each shorting connection; and
   an equipotential surface for reducing electromagnetic interference from the high voltage transmission line to internal components of the power flow control device, and from the internal components of the power flow control device to the high voltage transmission line.

2. The enclosure of claim 1, further comprising:
   a steel plate for dividing the enclosure into a first current area and a second current area which is lower in current than the first current area.

3. The enclosure of claim 1, further comprising:
   a plurality of current switches connected in series and configured to function as a current bypass switch during a fault condition.

4. The enclosure of claim 3, further comprising:
   a vacuum interrupter to interrupt a current flowing in a sensing/interrupter branch of the current bypass switch.

5. The enclosure of claim 4, further comprising:
   at least one differential mode choke connected in series with the vacuum interrupter.

6. The enclosure of claim 1, further comprising:
   a conductive gasket disposed between mating surfaces of panels; and
   means for compressing the conductive gasket between the mating surfaces of the panels.

7. The enclosure of claim 1, further comprising:
   a pair of power line connectors mounted externally to the enclosure to connect to the high voltage transmission line.

8. The enclosure of claim 1, further comprising:
   a corona ring mounted externally to the enclosure to reduce arcs to adjacent structures or to ground.

9. The enclosure of claim 1, further comprising:
   a metal oxide varistor to protect against transient voltage spikes.

10. The enclosure of claim 1, wherein the plurality of panels are aluminum panels.

11. The enclosure of claim 1, wherein the shorting connection comprises a shorting strap.

12. The enclosure of claim 1, further comprising:
    at least one differential mode choke connected in series with a vacuum interrupter; and
    a plurality of current switches connected in parallel with the at least one differential mode choke and the vacuum interrupter,
    wherein the plurality of current switches is configured to function as a current bypass during a fault condition.

13. The enclosure of claim 1, further comprising:
    a lifting bracket mounted on a top of the enclosure.

14. A method for reducing electrical interference in a power flow control device connected to a high voltage transmission line, the method comprising:
  providing a sealed enclosure around the power flow control device wherein a plurality of panels, formed of metal, are attached together with conductive gaskets therebetween;
  providing a shorting connection between each pair of the plurality of panels;
  providing an electrical connection between at least one of the plurality of panels and the high voltage transmission line;
  providing a receiving region on each panel for each shorting connection; and
  providing an equipotential assembly that floats at a potential of the high voltage transmission line, wherein the equipotential assembly comprises the sealed enclosure, whereby electromagnetic interference is reduced from the high voltage transmission line to internal components of the power flow control device, and from the internal components of the power flow control device to the high voltage transmission line.

15. The method of claim 14, further comprising:
  providing a steel plate for dividing the sealed enclosure into a first current area and a second current area which is lower in current than the first current area.

16. The method of claim 14, further comprising:
  providing a plurality of current switches connected in series and configured to function as a current bypass switch during a fault condition.

17. The method of claim 14, wherein the plurality of panels are aluminum panels.

18. The method of claim 14, further comprising:
  interrupting, by using a vacuum interrupter, a current flowing in the high voltage transmission line.

19. The method of claim 14, further comprising:
  connecting, by using a pair of power line connectors, the power flow control device to the high voltage transmission line.

20. The method of claim 14, further comprising:
  identifying, by a controller, that a fault current exists in an impedance injection module;
  closing a vacuum interrupter in response to identifying that the fault current exists, the vacuum interrupter coupled in series with at least one differential mode choke; and
  closing a plurality of current switches to pass the fault current, the plurality of current switches coupled in parallel with the vacuum interrupter and the at least one differential mode choke, whereby the impedance injection module is protected from the fault current.

* * * * *